United States Patent
Reents

(10) Patent No.: US 7,462,934 B2
(45) Date of Patent: Dec. 9, 2008

(54) INTEGRATED HEAT SINK

(75) Inventor: Jeffrey Reents, Carnation, WA (US)

(73) Assignee: Microsoft Corporation, Redmond, WA (US)

( * ) Notice: Subject to any disclaimer, the term of this patent is extended or adjusted under 35 U.S.C. 154(b) by 200 days.

(21) Appl. No.: 11/471,336

(22) Filed: Jun. 20, 2006

(65) Prior Publication Data

US 2007/0290330 A1    Dec. 20, 2007

(51) Int. Cl.
*H01L 23/10* (2006.01)
*H01L 23/34* (2006.01)

(52) U.S. Cl. ............... 257/719; 257/707; 257/712; 257/713

(58) Field of Classification Search ........... 257/712, 257/713, 707, 719, E23.084
See application file for complete search history.

(56) References Cited

U.S. PATENT DOCUMENTS

| | | | | |
|---|---|---|---|---|
| 5,391,841 | A | | 2/1995 | Quick .................... 174/258 |
| 5,780,928 | A | | 7/1998 | Rostoker et al. .......... 257/713 |
| 5,990,552 | A | * | 11/1999 | Xie et al. ............... 257/718 |
| 6,019,164 | A | * | 2/2000 | Getchel et al. ........... 165/80.1 |
| 6,223,815 | B1 | | 5/2001 | Shibasaki ............... 165/185 |
| 6,239,972 | B1 | | 5/2001 | Tehan et al. ............. 361/704 |
| 6,392,889 | B1 | * | 5/2002 | Lee et al. ............... 361/704 |
| 6,462,410 | B1 | | 10/2002 | Novotny et al. .......... 257/707 |
| 6,661,660 | B2 | | 12/2003 | Prasher et al. ........... 361/700 |
| 6,767,766 | B2 | | 7/2004 | Chu et al. .............. 438/122 |
| 6,801,431 | B2 | * | 10/2004 | Hartke et al. ............ 361/704 |
| 6,920,052 | B2 | * | 7/2005 | Callahan et al. .......... 361/767 |
| 6,940,716 | B1 | | 9/2005 | Korinsky et al. .......... 361/695 |
| 6,969,907 | B2 | | 11/2005 | Imai et al. .............. 257/713 |
| 7,142,422 | B2 | * | 11/2006 | Lee et al. ............... 361/695 |
| 2002/0113306 | A1 | * | 8/2002 | Kwon et al. ............. 257/691 |
| 2003/0085453 | A1 | | 5/2003 | Eyman et al. ............ 257/678 |
| 2004/0155251 | A1 | | 8/2004 | Abramov et al. .......... 257/81 |

OTHER PUBLICATIONS

"An Innovative Sheet-type Heat Sink has been Developed for Heat Dissipation o Mobile Equipment—The Thinnest Heat Conductor in the World", Apr. 11, 2003, http://www.furukawa.co.jp/english/what/peraflex030411$_{13}$ e.htm, 2 pages.

Agonafer, D. et al., "Numerical Investigation of Enclosure Effects on Spot Cooling Devices", *2004 Inter Society Conference on Thermal Phenomena*, 2004, 339-343, http://ieeexplore.ieee.org/iel5/9211/29232/013191494.pdf?tp=&arnumber=1319194&isnumber=29232.

Paparrizos, G., "An Integrated Fan Speed Control Solution Can Lower System Costs, Reduce Acoustic Noise, Power Consumption and Enhance System Reliability", *2003 Microchip Technology, Int.*, 2003, 8 pages, http://ww1.microchip.com/downloads/en/AppNotes/tb063a.pdf.

Vafai, K. et al., "Analysis of Two-Layered Micro-Channel Heat Sink Concept in Electronic Cooling", *International Journal of Heat and Mass Transfer*, 1999, 42, 2287-2297.

* cited by examiner

*Primary Examiner*—Nitin Parekh
(74) *Attorney, Agent, or Firm*—Woodcock Washburn LLP

(57) ABSTRACT

An integrated heat sink comprises a plurality of heat sink portions. The integrated heat sink provides efficient transfer of heat from a non-planar surface. In an example configuration two heat sinks are integrated to provide a thermal solution for dual bare die silicon circuits on a common substrate. One of the heat sinks in the integrated heat sink is compressively coupled to an integrated circuit via an integral spring assembly. The spring assembly pushes one of the heat sinks against one of the integrated circuits while allowing the other heat sink to remain positioned against the other integrated circuit. The integrated heat sink compensates for variations in circuit height. The integrated heat sink obviates the need for independent heat sinks for transferring heat from a non-planar surface.

9 Claims, 9 Drawing Sheets

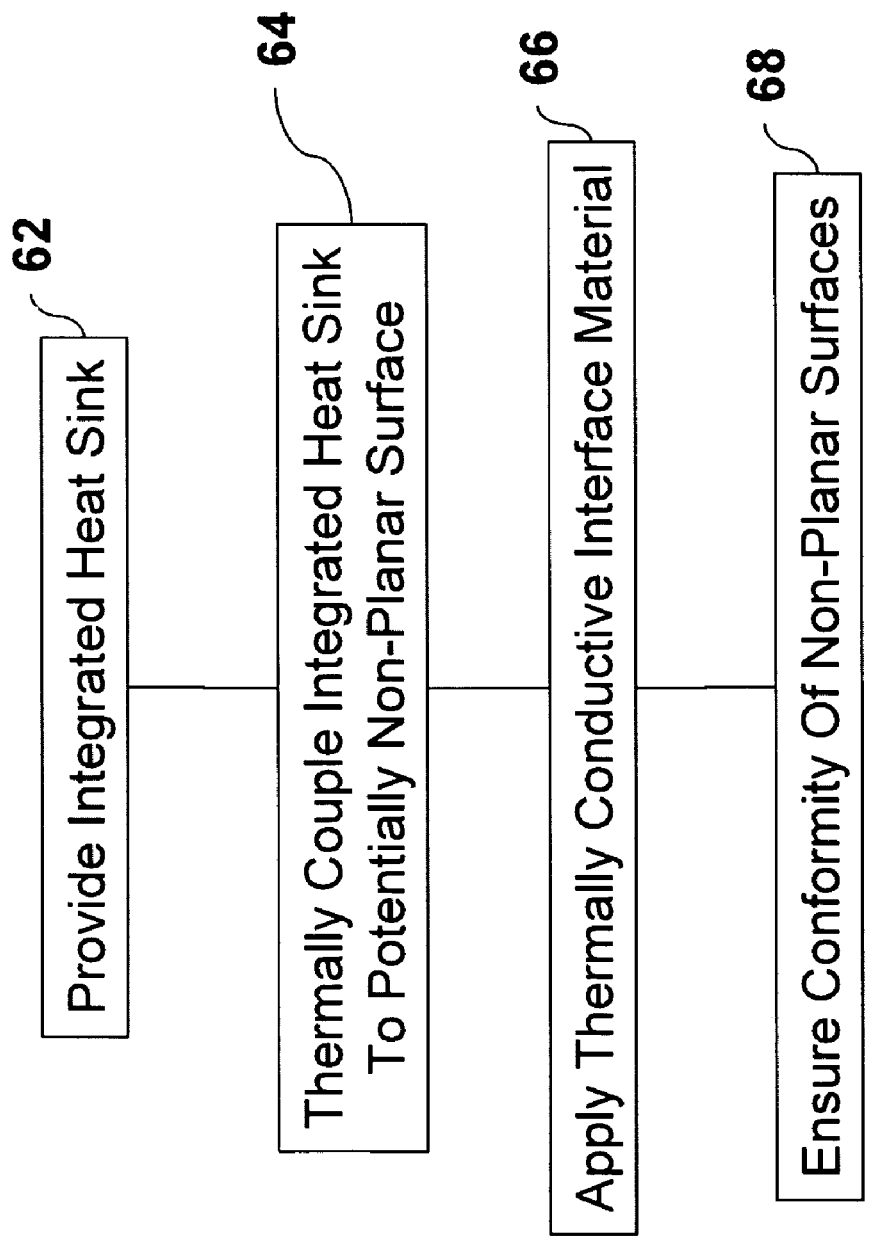

INTEGRATED HEAT SINK

TECHNICAL FIELD

The technical field generally relates to heat sinks and more specifically relates to heat sinks for non-planar surfaces.

BACKGROUND

Heat sinks are commonly used to transfer heat from a component, such as an integrated circuit. Integrated circuits typically require thermal management to limit the temperature of the component to ensure component performance and prolong component life. Typically, a heat sink is placed adjacent to the component, such that a surface of the heat sink is in thermal contact with a surface of the component. It is not uncommon to place a thermally conductive interface material in the junction between the surfaces to increase thermal conductivity between the surfaces and to reduce the temperature in the junction (Tj).

Many electronic package designs comprise more than one component mounted onto a single substrate. Typical thermal applications focus on compressive loading of the heat sink to the component generating the most heat. Due to manufacturing tolerances, the heights of the components from the substrate can differ resulting in a non-planar surface across the components. Thus, gaps can exist between the surface of the heat sink and the surface of the shorter components. Heat builds up in these gaps, which can detrimentally affect the components. Also, the close proximity of the components to each other can prevent the use of independent heat sinks for each component.

SUMMARY

This Summary is provided to introduce a selection of concepts in a simplified form that are further described below in the Detailed Description Of Illustrative Embodiments. This Summary is not intended to identify key features or essential features of the claimed subject matter, nor is it intended to be used to limit the scope of the claimed subject matter.

An integrated heat sink provides a thermal solution for components having a composite non-planar surface. In an example configuration the heat sink provides a thermal solution for dual bare die silicon integrated circuits. In this example configuration, the heat sink comprises two heat sinking portions to provide enhanced thermal energy transfer from two separate components on a common substrate. The two components form a composite non-planar surface. That is, one component sits higher on the substrate than the other component. The exemplary configured heat sink comprises two heats sink portions compressively coupled together by a spring or wave washer assembly. The compressive coupling pushes one of the heat sinking portions, referred to herein as the secondary portion for the sake of discussion, toward the lower one of the components causing the secondary portion to be compressively coupled to lower components. The other portion of the heat sink is coupled to the higher component. The heat sink compensates for component height variation and creates a compressive force between the portions of the heat sink and the individual components. An effective thermal interface is generated between each portion of the heat sink and each component, thus obviating the necessity of having an independent heat sink for each component.

BRIEF DESCRIPTION OF THE DRAWINGS

The foregoing summary, as well as the following detailed description, is better understood when read in conjunction with the appended drawings. For the purpose of illustrating integrated heat sink, there is shown in the drawings exemplary constructions thereof, however, integrated heat sink is not limited to the specific methods and instrumentalities disclosed.

FIG. 9 is a flow diagram of an example process for transferring thermal energy from a non-planar surface.

DETAILED DESCRIPTION OF ILLUSTRATIVE EMBODIMENTS

Figure 1:
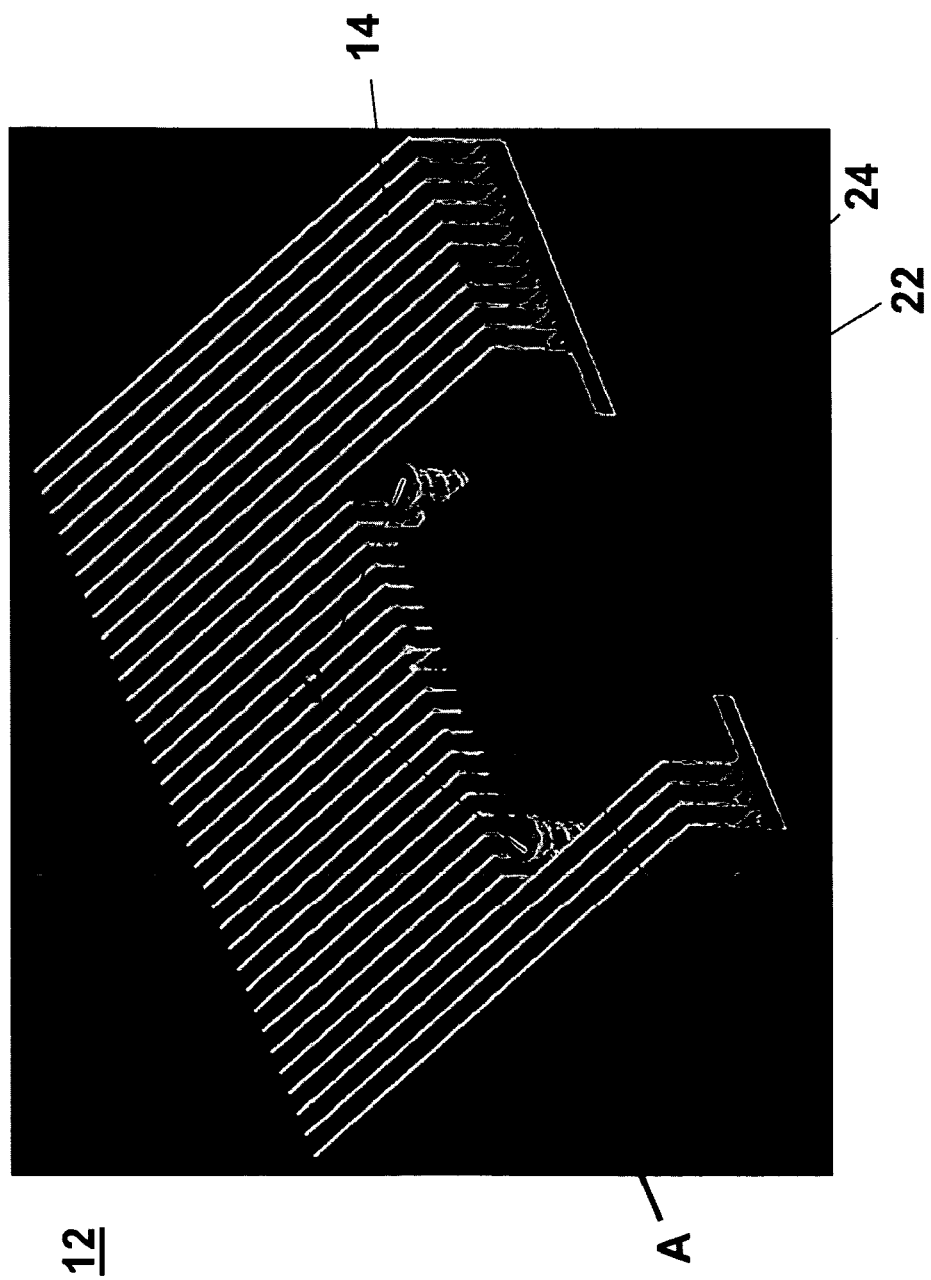
FIG. 1 is an illustration of an example configuration of an integrated heat sink.

FIG. 1 is an illustration of an example configuration of an integrated heat sink 12 comprising a first portion 14, integrated with a second portion 16, and a resilient fastening means 18. The second portion 16 and the first portion 14 are compressively coupled by the fastening means 18. The fastening means 18 provides a force in the direction of arrow 20 against the second portion 16. This force compresses the second portion 16 and the first portion 14 together. The force provided by the fastening means 18 pushes the second portion 16 in the direction of the arrow 20 with respect to the first portion 14. The flanges 26 of the second portion 16 are pushed against the first portion 14 as a result of the force. The mating surface 22 of the second portion 16, is pushed past the mating surface 24 of the first portion 14. The distance between the mating surface 22 and the mating surface 24 is variable in a direction indicated by the arrow 20 in accordance with a force placed upon the second heat sink portion 16 by the resilient fastening means 18.

Figure 2:
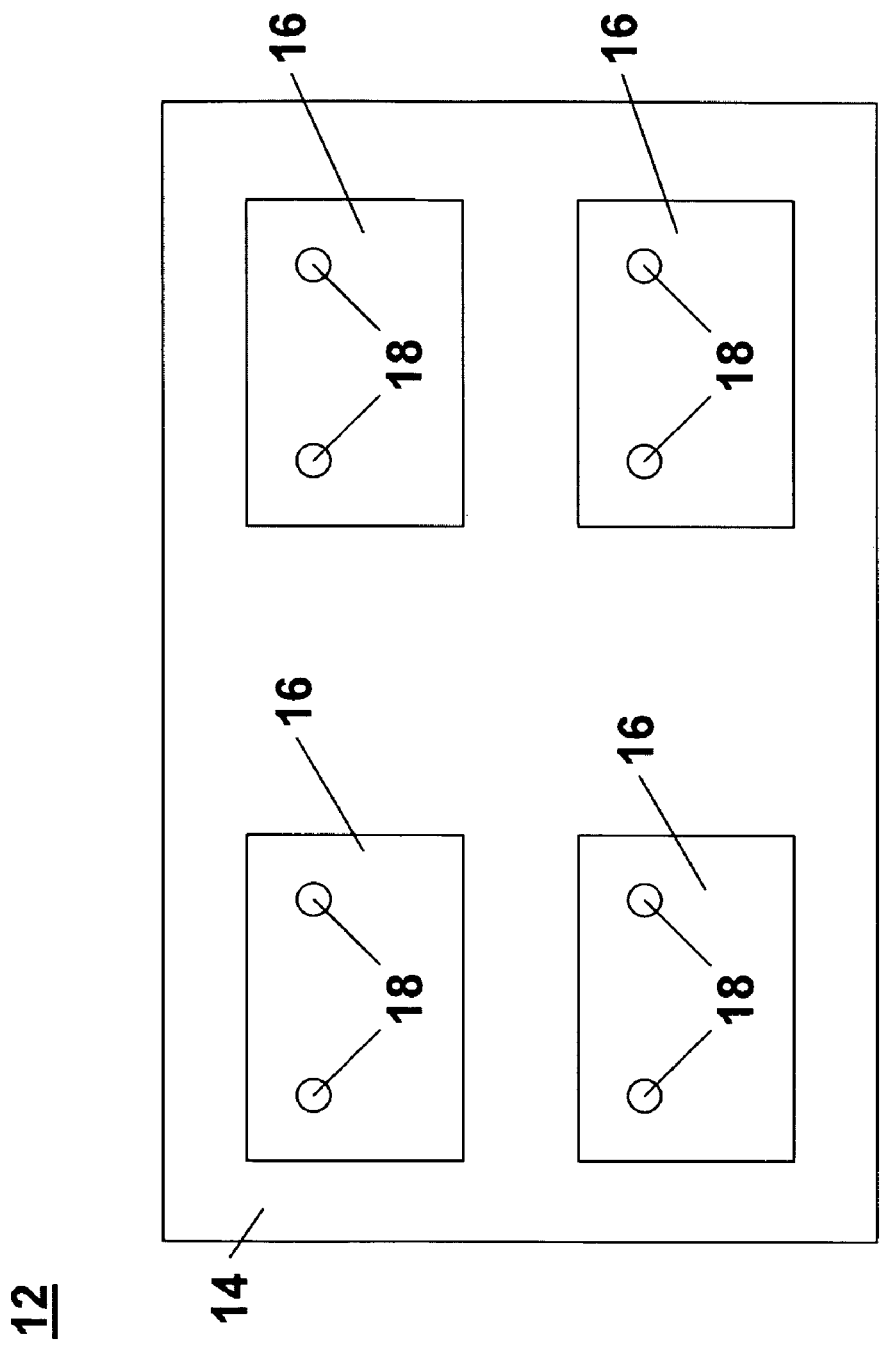
FIG. 2 is a diagram of an integrated heat sink comprising a plurality of heat sink portions.

FIG. 2 is a diagram of an integrated heat sink 12 comprising a plurality of second heat sink portions 16. The heat sink 12 can comprise various configurations. The heat sink 12 can comprise any appropriate number of second heat sink portions and resilient fastening means. For example, as shown in FIG. 2, the heat sink 12 can comprise four second heat sink portions 16. Each of the second heat sink portions 16 is compressively coupled to the first heat sink portion 14 via resilient fastening means 18.

Figure 3:
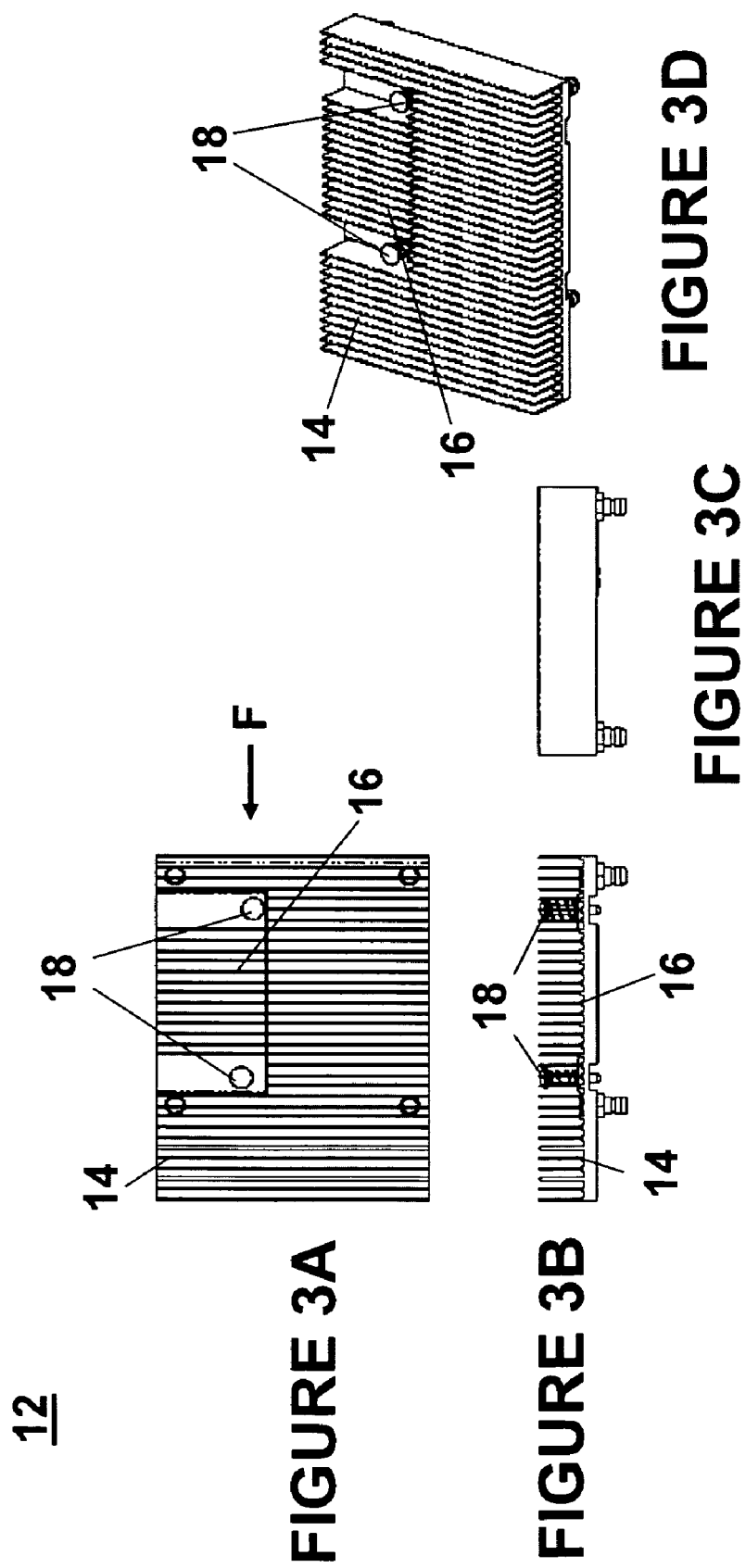
FIG. 3 depicts a top view, a side view, a side profile, and a three dimensional illustration of the integrated heat sink.

FIG. 3 depicts a top view, a side view, a side profile, and a three dimensional illustration of the heat sink 12. FIG. 3A illustrates a top view of the heat sink 12, comprising the first portion 14, the second portion 16, and the resilient fastening means 18. FIG. 3B illustrates a side view of the heat sink 12 viewed in the direction indicated by F. FIG. 3C depicts a side profile of the heat sink 12 viewed in the direction indicated by G. FIG. 3D is a three dimensional illustration of the heat sink 12.

Figure 4:
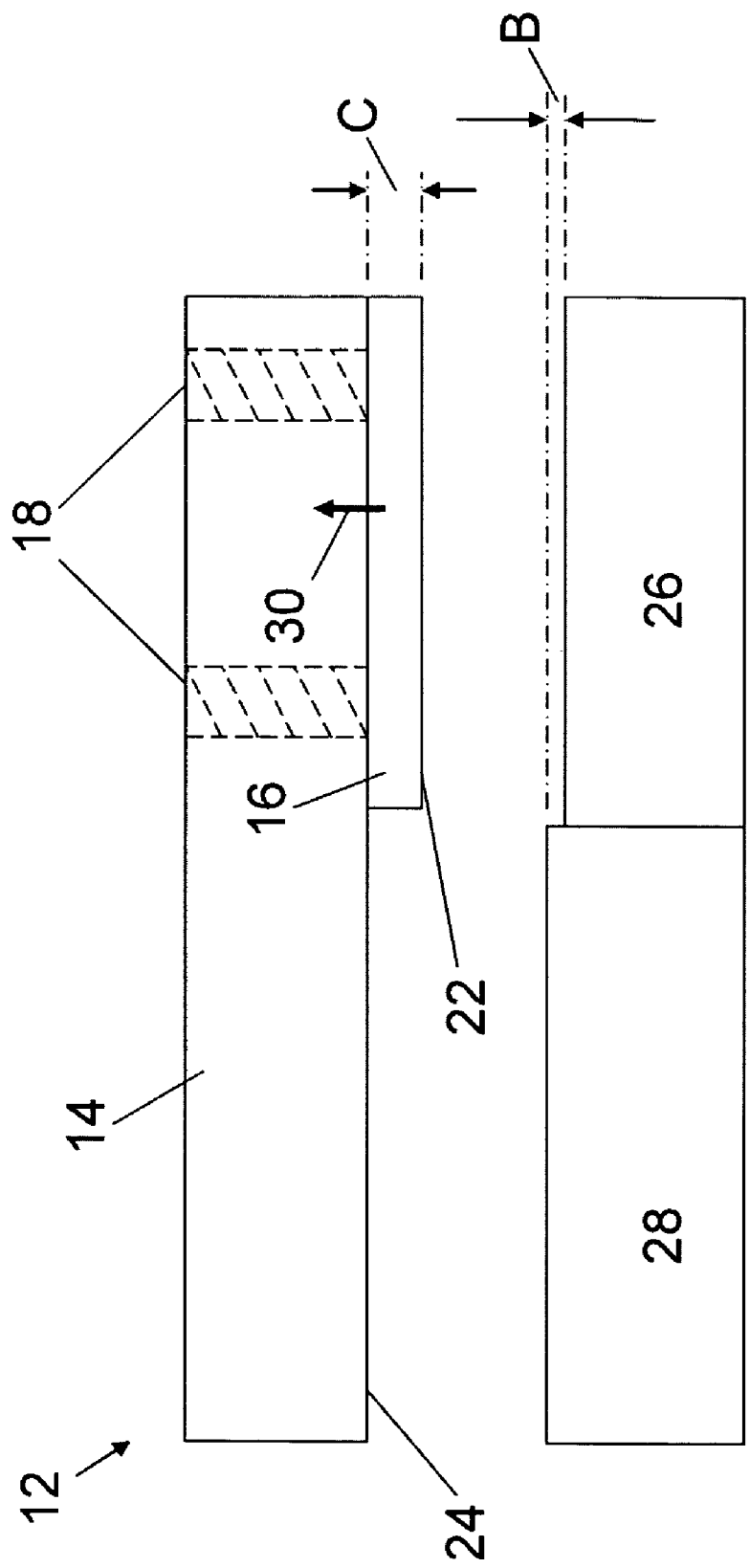
FIG. 4 illustrates another side view of the integrated heat sink.

FIG. 4 illustrates a side view of the of the heat sink 12 as viewed in the direction indicated by A in FIG. 1. In use, the mating surfaces 22 and 24 are thermally coupled to components 26 and 28, respectively, for the purpose of transferring thermal energy from the components 26 and 28, via the heat sink 12. The mating surfaces 22 and 24 are essentially parallel to each other. The composite surface of the mating surfaces 22 and 24 can conform to the profile of components having a non-planar surface. For example, as depicted in FIG. 4, the difference in height, B, between component 26 and component 28, is less than the difference in distance, C, between the mating surface 22 and the mating surface 24. As the components 26 and 28 are coupled to the mating surfaces 22 and 24, the second portion 16 will move in the direction of arrow 30. The resilient fasteners 18 allow the second portion 16 to move in the direction of the arrow 30, thus resulting in the composite surface of the mating surfaces 22 and 24 conforming to the composite surface of the components 26 and 28.

Figure 5:
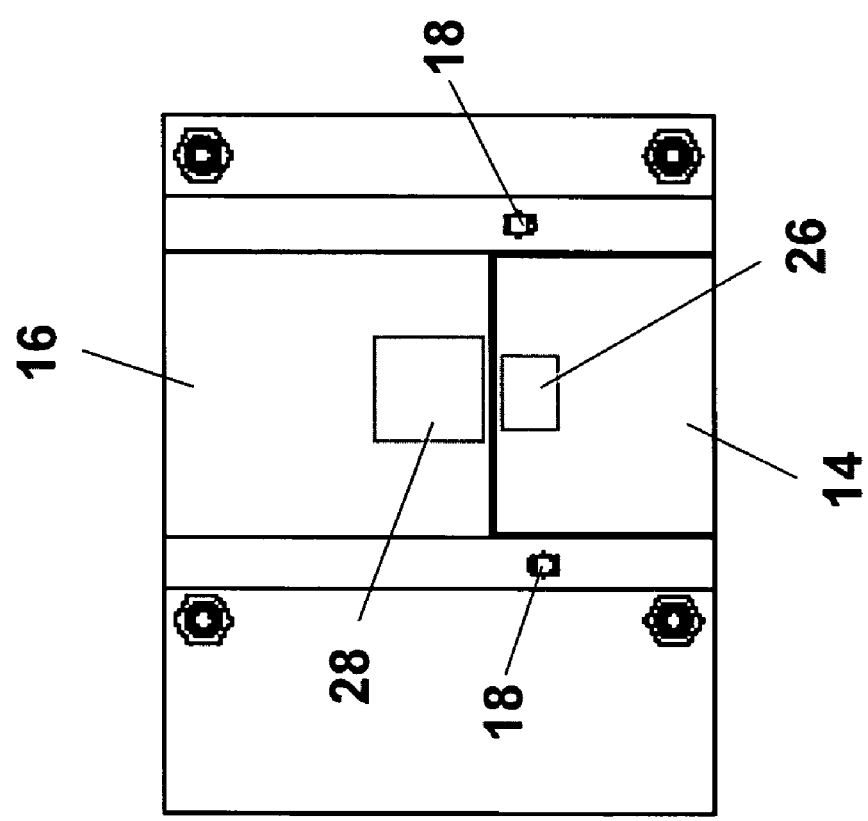
FIG. 5 is an illustration of a bottom view of the integrated heat sink showing an example placement of components.

FIG. 5 is an illustration of a bottom view of the heat sink 12 showing an example placement of the components 26 and 28 in accordance with the description of FIG. 4. As shown in FIG. 5, component 28 is larger than 26. This is to depict that the component 28 produces more heat than the component 26, and thus is thermally coupled to the larger heat sink portion 16. The smaller component, 26, produces less heat than the component 28, and accordingly is thermally coupled to the smaller heat sink portion 14.

Figure 6:
FIG. 6 is an illustration of another example configuration of an integrated heat sink.

FIG. 6 is an illustration of another example configuration of an integrated heat sink. The heat sink 12 depicted in FIG. 6 comprises a first heat sink portion 16 and a second heat sink portion 32. A second heat sink portion can comprise any appropriate shape and/or mass. For example, the second heat sink portion 32 is circular, or oval, shaped. The second portion 32 comprises less mass than the second portion 16 depicted in FIG. 1. A second heat sink portion having less mass will reduce the heat transferring capacity of the first portion less. The heat sink 12 can comprise any appropriate number of second heat sink portions 32.

Figure 7:
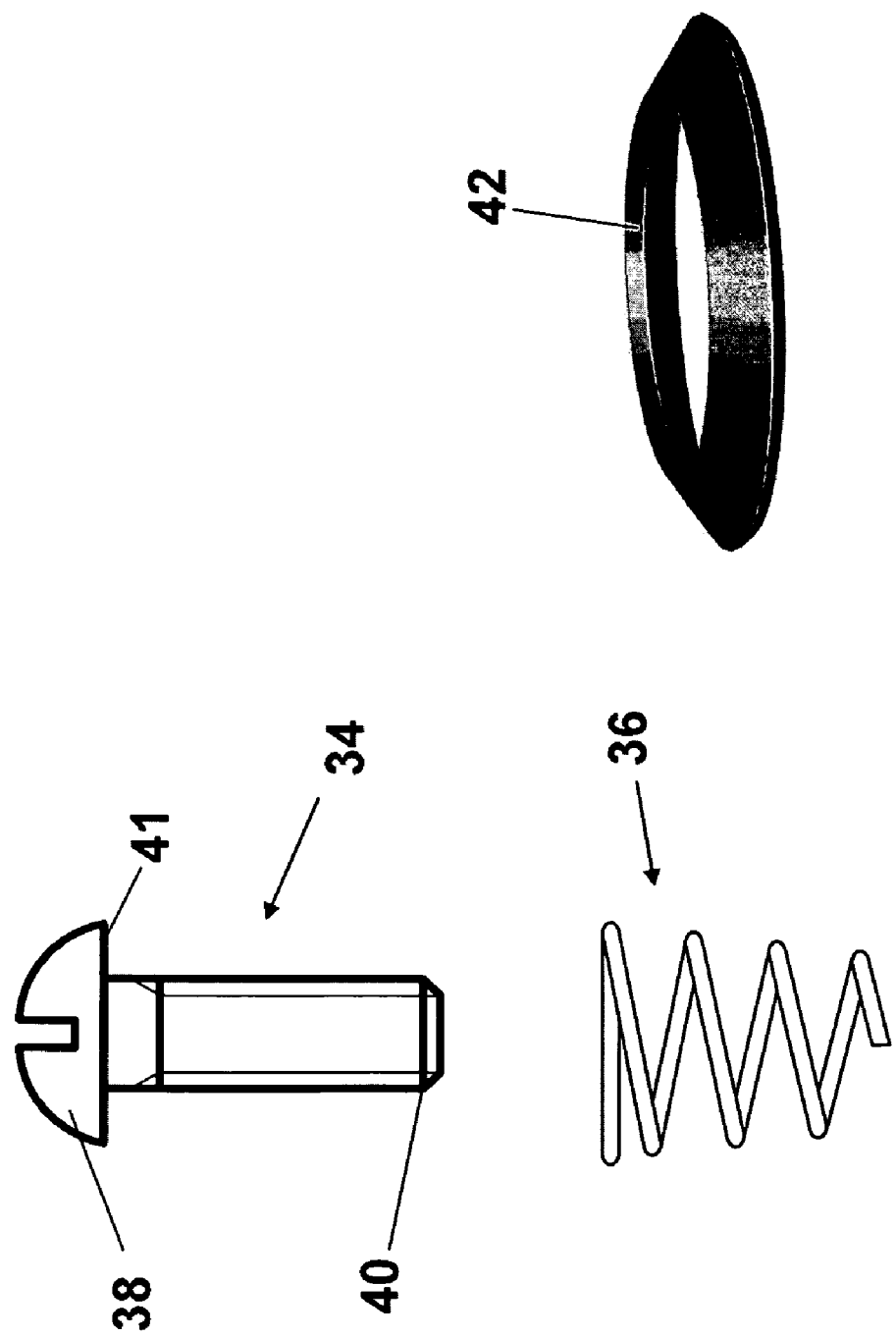
FIG. 7 is an illustration of an example resilient fastening means.

FIG. 7 is an illustration of an example resilient fastening means comprising an elongated member 34 and a resilient element 36. The elongated member 34 can comprise any appropriate elongated member, such as a bolt, a shaft, a screw, of the like, for example. The elongated member 34 comprises a proximate end 38 and a distal end 40. The proximate end 38 can comprise any appropriate configuration. For example, the proximate end 38 can be flanged 41 having no slots, can be flanged having at least one slot, can have cross slots (e.g., Phillips head), can be a bolt head, can have a single slot, can comprise a wing nut, or a combination thereof. The distal end 40 can comprise any appropriate configuration. For example, the distal end can be threaded, flanged, comprise a locking mechanism, can be cut flush with the shaft of the elongated member 34, can be beveled as shown in FIG. 7, or a combination thereof. When assembled, the resilient element 36, 40 is disposed around the elongated member 34 and positioned between the second heat sink portion and the proximate end 38 of the elongated member 34.

The resilient element 36 can comprise any appropriate resilient element. For example, the resilient element 36 can comprise a spring, a resilient washer (e.g., resilient tube), a wave washer, a spring washer (such as washer 42 for example), or any appropriate resilient element that, when the fastening means is assembled, will provide force against the first portion of the heat sink.

Figure 8:
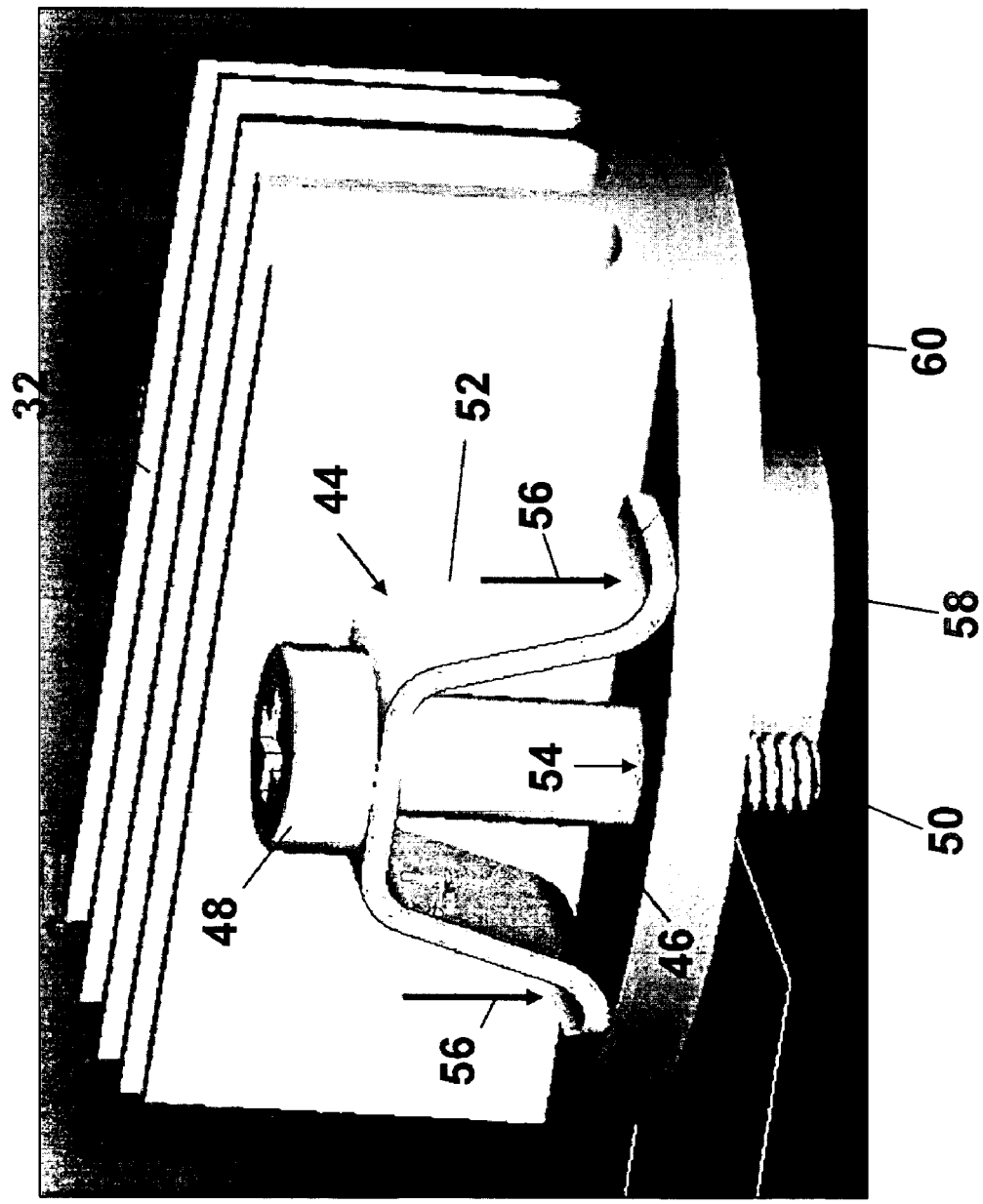
FIG. 8 is an illustration of another example resilient fastening means.

FIG. 8 is an illustration of an example resilient fastening means 44 comprising an elongated member 46 and a resilient element 52. The resilient fastening means 44 is shown configured with the second heat sink portion 32. The elongated member 46 comprises the proximate end 48 and the distal end 50. In the example configuration depicted in FIG. 8, the proximate end 48 is cross slotted and flanged, the distal end 50 is threaded, and the resilient element 52 comprises a wave washer. The second heat sink portion 32 forms an aperture 54 (e.g., opening, hole) through which the elongated member 46 is positioned. The inner diameter of the aperture 54, is larger than the outer diameter of the elongated portion 46, thus allowing relative movement between the elongated portion 46 and the second heat sink portion 32. When assembled, distal end of the elongated portion is attached to the first heat sink portion (Not shown in FIG. 8; see FIG. 6 for example.) When assembled, the wave washer 52 provides force in the direction of arrows 56 against the second heat sink portion 32. The force pushes the second heat sink portion 32 generally in the direction of arrows 56 until the surface of the flange 60 makes contact with the first heat sink portion, or until the mating surface 58 of the second portion 32 makes contact with a component there-under.

Although the distal end 50 of the elongated member 46 is depicted as being threadably attachable to the first heat sink portion, this depiction is exemplary. The distal end of the elongated portion can be attached to the first heat sink portion by any appropriate means. For example, the distal end of the elongated member can be adhesively attached, threadably attached via a nut, threadably attached via threads in the first heat sink portion, welded to the first heat sink portion, attached via a keyed detent, attachable via a locking mechanism, or a combination thereof.

FIG. 9 is a flow diagram of an example process for transferring thermal energy from a non-planar surface. The integrated heat sink is provided at step 62. The integrated heat sink comprises a plurality of heat conducting mating surfaces. The integrated heat sink is thermally coupled to a non-planar surface at step 64. The non-planar surface can be, for example, the surface of more than one electronic component. Thermally conductive interface material, optionally, can be applied at step 66. Thermally conductive interface material can be applied to the each of the mating surfaces of the integrated heat sink and/or between the plurality of heat sink portions, for example. At step 68, conformity between the mating surfaces of the integrated heat sink and the non-planar surface can be ensured. For example, the resilient fastening means could be adjusted to obtain as efficiency heat transfer as possible. It is envisioned, however, that the force applied by the resilient member of the resilient fastening means will obviate the need for adjustment.

While an integrated heat sink has been described in connection with the example embodiments of the various figures, it is to be understood that other similar embodiments can be used or modifications and additions can be made to the described embodiments for performing the same functions of an integrated heat sink without deviating therefrom. Therefore, an integrated heat sink as described herein should not be limited to any single embodiment, but rather should be construed in breadth and scope in accordance with the appended claims.

What is claimed:

1. A heat sink comprising:
    a first portion comprising a first surface;
    a second portion comprising a second surface, wherein:
    the first surface is facing essentially a same direction as the second surface;
    the first surface is essentially parallel to the second surface; and
    the second portion is compressively coupled to the first portion and defines at least one aperture therein; and
    resilient fastening means for compressively coupling the first portion to the second portion, and comprising at least one elongated member, wherein:

each elongated member comprises a distal end and a proximate end; and the distal end of each elongated member is attached to the first portion and extends, respectively, through each of the at least one aperture; and at least one resilient element disposed, respectively, around each of the at least one elongated member and positioned between the second portion and the proximate end of the respective elongated member; wherein:

a distance between the first surface and the second surface is variable in a direction in accordance with a force placed upon the second portion by the resilient fastening means.

2. A heat sink in accordance with claim 1, wherein the first surface is essentially planar and the second surface is essential planar.

3. A heat sink in accordance with claim 1, wherein the resilient fastening means comprises a spring.

4. A heat sink in accordance with claim 1, wherein the resilient fastening means comprises wave washer.

5. A heat sink in accordance with claim 1, further comprising a thermally conductive material between the first portion and the second portion.

6. A heat sink in accordance with claim 1, wherein the distal end of each of the at least one elongated member is threadably attached to the first portion.

7. A heat sink in accordance with claim 1, wherein the distal end of each of the at least one elongated member is at least one of lockably engaged to the first portion and engaged via a detent to the first portion.

8. A heat sink in accordance with claim 1, wherein the heat sink is for transferring thermal energy from a plurality of electronic components forming a non-planar surface.

9. A heat sink in accordance with claim 1, wherein:

the first surface of the heat sink is adapted to be compressively coupled to a first component; and the second surface of the heat sink is adapted to be compressively coupled to a second component, wherein the first component is different from the second component.

* * * * *